United States Patent [19]

Dössel

[11] Patent Number: 5,012,190

[45] Date of Patent: Apr. 30, 1991

[54] APPARATUS FOR MULTI-CHANNEL MEASUREMENT OF WEAK MAGNETIC FIELDS WITH SQUIDS AND SUPERCONDUCTING GRADIOMETERS ON INDIVIDUAL DETACHABLE ASSEMBLIES, AND METHOD OF MANUFACTURE

[75] Inventor: Olaf H. Dössel, Tangstedt, Fed. Rep. of Germany

[73] Assignee: U.S. Philips Corporation, New York, N.Y.

[21] Appl. No.: 260,107

[22] Filed: Oct. 19, 1988

[30] Foreign Application Priority Data

Oct. 22, 1987 [DE] Fed. Rep. of Germany ....... 3735668

[51] Int. Cl.[5] ...................... G01R 33/02; H01L 39/24
[52] U.S. Cl. ........................................ 324/248; 29/599
[58] Field of Search ........................... 324/248; 29/599; 357/75, 80

[56] References Cited

U.S. PATENT DOCUMENTS

| | | | |
|---|---|---|---|
| 3,805,123 | 4/1974 | Rieger | 357/25 |
| 4,694,567 | 9/1987 | Daalmans | 324/248 |
| 4,749,946 | 6/1988 | Hoenig | 324/248 |
| 4,771,239 | 9/1988 | Hoenig | 324/248 |

*Primary Examiner*—Walter E. Snow
*Attorney, Agent, or Firm*—Jack D. Slobod

[57] ABSTRACT

Apparatus for multi-channel measurement of weak magnetic fields having assigned to each channel an assembly, which is arranged on a base carrier (30) and includes a DC-SQUID (6, 27), a gradiometer coil (8, 12, 15, 16, 37), a coupling-in coil (9, 19, 38), superconductive connecting leads (10, 17, 18, 41), and a modulation coil (7, 26). The gradiometer coil, the coupling-in coil and the SQUID are made from thin-film structures. An evaluation element (11) serves to evaluate the signals generated in each channel by the SQUIDS. A separate plate (29) is provided for each channel, on which the SQUID and the modulation coil are deposited. The assembly of gradiometer coil, connecting leads and coupling-in coil provided for each channel is deposited on a separate gradiometer carrier (12, 32). A plate is arranged on a gradiometer carrier, and the individual gradiometer carriers are attached to the base carrier.

14 Claims, 3 Drawing Sheets

APPARATUS FOR MULTI-CHANNEL MEASUREMENT OF WEAK MAGNETIC FIELDS WITH SQUIDS AND SUPERCONDUCTING GRADIOMETERS ON INDIVIDUAL DETACHABLE ASSEMBLIES, AND METHOD OF MANUFACTURE

The invention relates to an apparatus for multichannel measurement of weak magnetic fields having assigned to each channel an assembly, which is arranged on a base carrier, and comprises a superconductive quantum interference device (SQUID), at least one gradiometer coil serving to detect the magnetic field, at least one coupling-in coil serving to couple the field into the SQUID, superconductive connecting leads between the gradiometer coil and the coupling-in coil, and a modulation coil, at least the gradiometer coil, the coupling-in coil and the SQUID being made of thin-film structures, said apparatus further having an evaluation device serving to evaluate the signals generated in each channel by the SQUIDS.

Superconductive quantum interference devices, known as SQUIDS, are employed to measure weak magnetic fields in a field strength range below $10^{-10}$ Tesla. In medical technology, the SQUIDS serve to measure the magnetic fields of the heart or of the brain (magnetocardiography, magnetoencephalography), or also to conduct liver diagnostics (study of liver susceptibility).

An apparatus for measuring such weak magnetic fields contains a gradiometer, a coupling-in coil, a SQUID, a modulation coil, amplifiers and an evaluation device. The gradiometer, the coupling-in coil, the SQUID and the modulation coil are jointly accommodated in a cryogenic system for the low-temperature range, in order to produce superconductivity. The gradiometer coil detects the magnetic field to be measured, which is transformed and coupled into the SQUID by a smaller coupling-in coil arranged at the SQUID. The gradiometer and coupling-in coil form a closed superconductive electric circuit. Both RF-SQUIDS (high frequency or radio frequency SQUIDS) and also DC-SQUIDS (direct current SQUIDS) are used in the measurement of such magnetic fields.

The DC-SQUID consists of a closed superconductive loop, which is broken by two Josephson contacts. A non-superconductive direct current connection is provided between the Josephson contacts. The voltage between the connections would have to vary as a function of the coupled-in magnetic field, if the latter was not held largely constant by means of the modulation coil, which generates an opposing magnetic field (flux-locked-loop). From the current required for the modulation coil, conclusions are drawn as to the magnitude of the external magnetic field. In this process, a high-frequency field is superimposed on the field to be measured by means of the modulation coil. The amplifier amplifies only signals which correspond to the frequency and the phase angle of the high-frequency field (lock-in-technique).

In order to obtain a spatial field distribution, a plurality of SQUIDS, each with an assigned gradiometer are arranged around the measuring point, their measuring signals being led to an evaluation unit via a plurality of channels.

The apparatus mentioned at the beginning for the measurement of weak magnetic fields is known from EP-B-0,111,827. Using thin-film technology, the gradiometer coils and the connecting leads provided for each measurement channel are deposited on a base carrier, a quartz or silicon plate. Together with the coupling-in coils, the SQUIDS are located on a further carrier. The superconductive connections required between the gradiometers and the coupling-in coils are realised by soldering. Such an apparatus can frequently fail because of defective soldered joints, which are caused by ageing effects and by the large temperature difference between manufacture and measurement operations. The gradiometer coils are arranged in a stable fashion next to one another so that they can detect a certain type of magnetic field.

An apparatus which, for example, is to serve to measure the magnetic fields of the head, requires a base carrier with an arc-shaped surface. The manufacture of such an apparatus is complicated.

The failure of a SQUID or of a gradiometer coil leads to the failure of the entire apparatus, since it is not possible to exchange a single gradiometer or a single SQUID. It is equally impossible subsequently to rearrange the gradiometer coils or the SQUIDS for example, from a base carrier with a plane surface to a base carrier with an arc-shaped surface.

SUMMARY OF THE INVENTION

It is therefore an object of the invention to create an apparatus for multi-channel measurement of weak magnetic fields which is easy to manufacture, can be adapted to different shapes, and is provided with easily exchangeable elementary units.

This object is achieved with an apparatus of the type mentioned at the beginning in that a separate plate is provided for each channel, on which the SQUID and the modulation coil are deposited, in that the assembly provided for each channel and consisting of gradiometer coil, connecting leads and coupling-in coil is in each case deposited on a separate gradiometer carrier, and in that a plate is arranged on a gradiometer carrier, and the individual gradiometer carriers are attached to the base carrier.

In the apparatus according to the invention, the gradiometer coils and the connecting leads are not directly deposited on the base carrier using thin-film technology, but in each case a gradiometer having at least one coil, and a coupling-in coil having the necessary connecting leads for a channel are deposited on a gradiometer carrier, which is, for example, cuboid, using thin-film technology. A plate with the SQUID and the modulation coil for a channel are applied over the coupling-in coil. Such gradiometer coils can then be arranged in a single fashion on an arbitrarily shaped base carrier. When manufacturing the gradiometer carriers, it is preferable to proceed in such a way that they are first consolidated into a block and jointly coated. The thin-film circuits required for the gradiometer coils are formed before separation. It is possible to manufacture the SQUIDS in a similar fashion, attaching them to the gradiometer carrier after the process of individual separation. Because of this mode of construction, it is not necessary to provide further superconductive connections between the individual carriers or the plate.

In order to simplify the exchange of defective SQUIDS or gradiometer coils, it is provided that the plate is attached detachably to the gradiometer coil and that the gradiometer carriers are attached detachably to the base carrier. Preferably, the detachable connections are glued joints. These glued joints can be separated by the application of a mechanical force at a definite location, or with a suitable solvent.

A gradiometer carrier which is simple to manufacture can be used in connection with the application of a gradiometer of the first or higher order, in an embodiment of the apparatus according to the invention. This embodiment is characterized in that the gradiometer coils which have a common winding sense are arranged on a base face of the gradiometer carrier, and the gradiometer coils with counter-directed winding sense are arranged on an opposite base face of the gradiometer carrier. Because the coils of the gradiometer are counter-wound, a compensation of the terrestrial magnetic field, and of other homogeneous interference magnetic fields is achieved.

In a further development of the invention it is provided that the coupling-in coil is arranged on a side-face of the gradiometer carrier which connects the base faces.

Such a subcarrier is manufactured in that, firstly, photolithography is used to apply the gradiometer coils on opposite base faces of the gradiometer carrier and to apply the connecting leads and the coupling-in coil on a side face, and in that, subsequently, a plate, which contains the photolithographically deposited SQUID and modulation coil, is glued onto the side face after deposition of an insulating layer.

The connecting leads, which extend at the edges between the base faces and the side face, can, for example, extend over chamfered edges in grooves. Subsequently, these connecting leads can be soldered with superconductive material for an improved connection, as is described in EP-B-0,111,827. Another possibility consists in using for each connecting lead superconductive wires in grooves at the edges, on which wires thin-film leads are subsequently deposited after polishing. In this way, soldering at the edges is not necessary.

In another further development of the invention it is provided that the coupling-in coil is applied to a base face of the gradiometer carrier, on which a field-side gradiometer coil is arranged. In this connection, thin-film leads have to be applied only to two faces of the subcarrier. The connecting leads between the gradiometer coils are super& conductive wires extending in grooves of a side face of the gradiometer carrier, which connect the two opposite base faces on which the gradiometer coils are arranged.

Such a gradiometer carrier may be manufactured in that, firstly, grooves are cut into a side face of the body and superconductive wires are introduced into these grooves, in that, subsequently, after polishing of the two opposite base faces connecting the grooved side face, the gradiometer coils are photolithographically deposited, and in that a plate, which contains the photolithographically deposited SQUID and modulation coil, is glued onto the base faces after deposition of an insulating layer. The reliability of an apparatus manufactured according to this process is higher than that of the known apparatus, since it has not a single soldered joint. The connections of the normally conductive leads, which lead to the amplifiers and the evaluation element, are applied to the SQUID by the reliable bonding technique.

To achieve a good compensation of homogeneous magnetic fields, it is provided that on the base face which has no coupling-in coil there is deposited opposite the coupling-in coil a superconductive conductor structure, which essentially corresponds to the structure of the coupling-in coil.

In the detection of a magnetic field, it is advantageous if the measurement apparatus has as large a number of channels as possible on the predetermined circular area of the cryostat base. By employing gradiometer carriers having a hexagonal cross-section, it is possible to arrange an especially high number of measurement channels on a predetermined circular area.

Superconductive screens against interfering fields are arranged in a simple fashion between gradiometer carrier and coupling-in coil, and on the side of the plate turned away from the gradiometer carrier.

BRIEF DESCRIPTION OF THE DRAWINGS

Illustrative embodiments of the invention are further explained below with reference to the drawings, in which.

DESCRIPTION OF THE PREFERRED EMBODIMENTS

Figure 1:
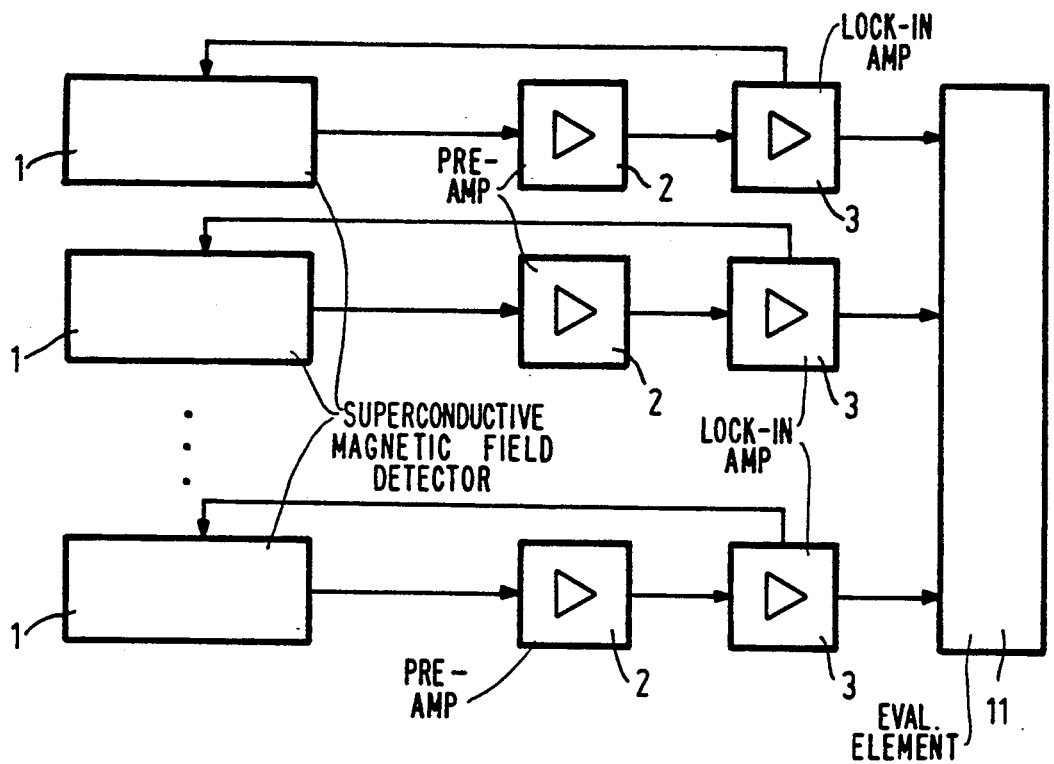
FIG. 1 shows the schematic representation of an apparatus for measuring weak magnetic fields, FIG. 1a being a circuit diagram, and FIG. 1b a device for detecting the magnetic field.
Figure 1:
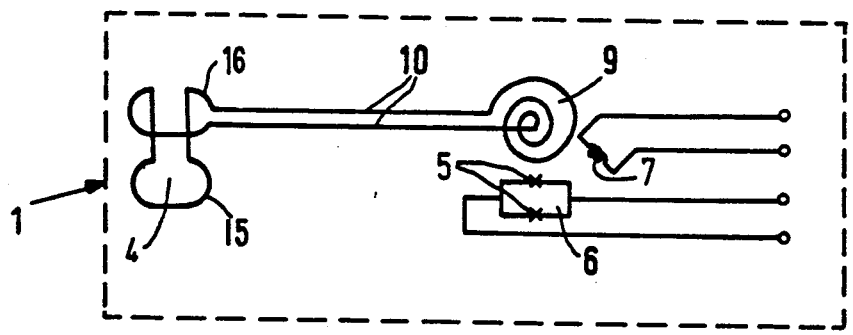

Represented in FIG. 1a is a circuit diagram of an apparatus for measuring weak magnetic fields which has a number of parallel measurement channels. Each channel contains a device 1 for detecting the magnetic field, a preamplifier 2 and a lock-in amplifier 3. The device 1 (FIG. 1b) consists of a superconductive gradiometer 4, a superconductive coupling-in coil 9, superconductive connecting leads 10, a direct current quantum interference device (DC-SQUID) 6 fitted with two Josephson contacts 5, and a superconductive modulation coil 7. The gradiometer 4 contains two coils 15 and 16 for detecting the magnetic field to be measured. The coupling-in coil 9 serves to transform the detected magnetic field into the SQUID 6. The coils 15, 9 and 16 are attached to one another by connecting leads 10. The connections of SQUID 6 lying between the Josephson contacts 5 are connected to normally conductive leads, which lead to the preamplifier 2. The direct voltage component led to the preamplifier 2 is held essentially constant with the aid of the modulation coil 7 controlled by the lock-in amplifier 3. The lock-in amplifier 3 leads to an evaluation element 11 a signal which is derived from the control signal of the modulation coil 7. A measure for the entire magnetic field detected by the channels is formed in the evaluation element 11 from the various signals generated in the channels.

The device 1 provided for each channel and consisting of gradiometer 4, coupling-in coil 9, SQUID 6 and modulation coil 7 is accommodated in a cryogenic system for generating the superconductivity. In this connection the particular devices 1 are accommodated on a common base carrier. The base carrier can have, for example, an arc-shaped surface for measuring the magnetic field of a head, or a plane surface for measuring the magnetic field of the heart. Accommodated on the base carrier are gradiometer carriers, which have a gradiometer 4, a coupling-in coil 9, a SQUID 6 and a modulation coil 7.

Figure 2:
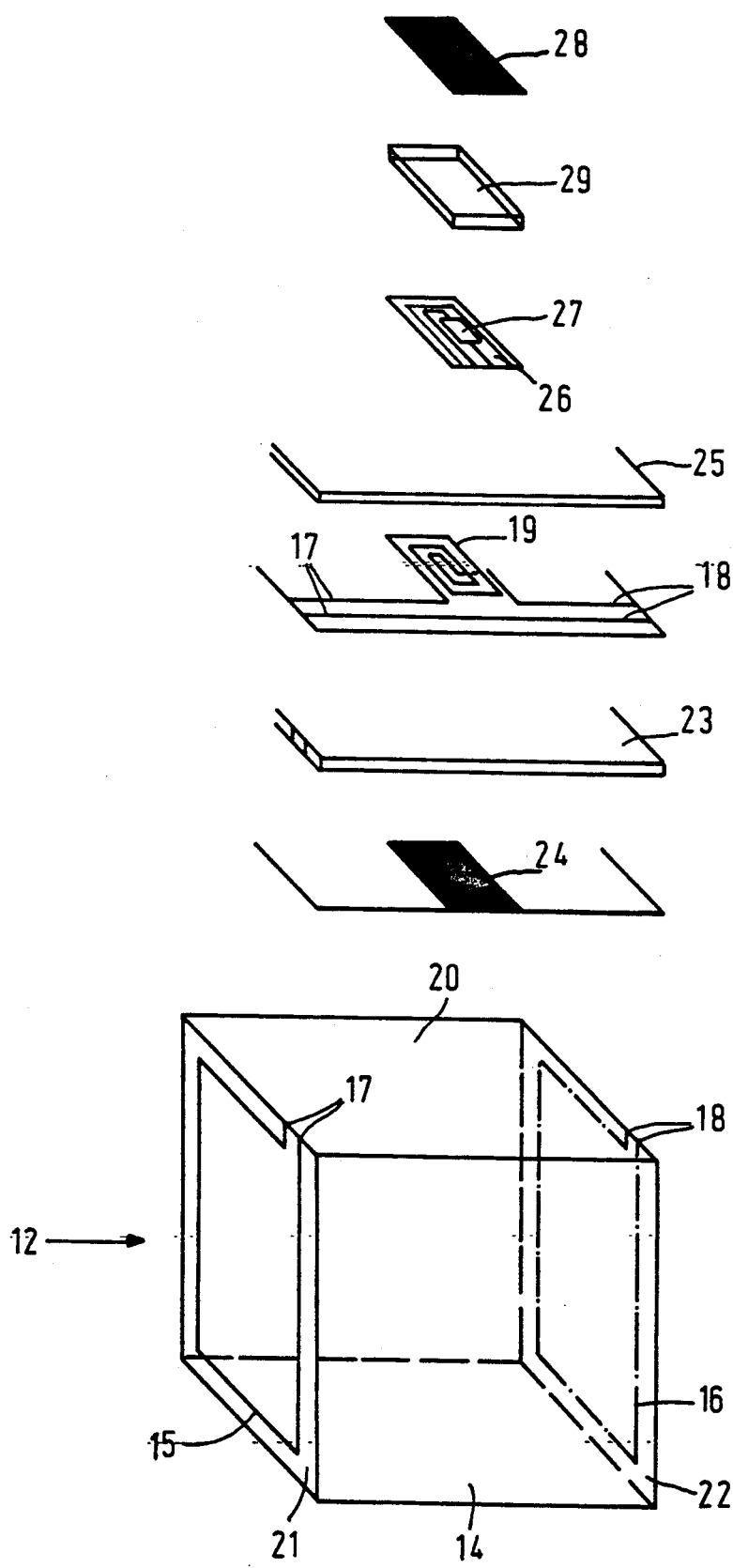
FIG. 2 shows a first illustrative embodiment of a gradiometer carrier in an exploded representation.

A first illustrative embodiment of a gradiometer carrier 12, which has a cuboid base body 14, is represented in FIG. 2. The body 14 can consist, for example of glass, quartz or silicon. Gradiometer coils 15 and 16 with counter-directed winding sense are deposited on two opposite base faces 21 and 22 of the body 14. Such a coil arrangement serves to compensate homogeneous magnetic fields, for example, the terrestrial magnetic field. The coils 15 and 16 can have, for example, a square shape and an edge length of 2 cm. A coupling-in coil 19 is deposited on a side face 20, which connects the two base faces 21 and 22. The gradiometer coils 15 and 16 are coupled to the coupling-in coil 19 via connecting leads 17 and 18. The coil 19 can, for example, be arranged centrally on the side face 20. One more superconductive screen 24 and an insulating layer 23, for example, of silicon oxide, is arranged between the coil 19 and the side face 20.

Separated by an insulating layer 25 of, for example, silicon oxide, a plate 29 with the DC-SQUID 27 and the modulation coil 26 is deposited on the coil 19. For screening purposes, a further superconductive layer 28 is applied to the side of the plate 29, on which the DC-SQUID is not deposited. The plate 29 is applied to the insulating layer 25 by glueing. In this connection, a glue, for example, Araldite, UHU-plus, or a varnish with the designation GE-7031, is to be used, with which the plate 29 can be separated from the insulating layer 25 by the application of a mechanical force at a suitable location, or with a suitable solvent.

In the manufacture of a gradiometer carrier 12, the first step is to realise the gradiometer coils 15 and 16 in a photolightographic step known per se, in the form of superconductive thin-film coils. Subsequently, there is deposited on the side face 20 firstly the screen 24, then the insulating layer 23 and subsequently the coil 19 and the leads 17 and 18. The insulating layer 25 is deposited on the insulating layer 23 with the superconducting leads 17 and 18 and the superconducting coil 19, and the previously manufactured plate 29 is then glued onto it. The modulation coil and the SQUID have been deposited on one side of the plate 29, likewise using the photolithographic technique, and the screen 28 has been applied to the other side. The coils 15, 16 and 19, the connecting leads 17 and 18, and the screens 24 and 28 consist, for example, of niobium thin films. The insulating layers 23 and 25 can be manufactured by vapor depositioning of silicon oxide, by spinning-on of a sol-gel with a subsequent baking process, or by using thick-film technology. The SQUID 27 consists, for example, of niobium nitride with thin insulating layers of magnesium oxide.

After manufacture of the gradiometer carrier, a single adjustment of the gradiometer coils 15 and 16 is undertaken. In particular, a laser beam can be employed for this purpose, with which the width of the individual coil windings can be reduced. It is expedient for the adjustment to take place after test measurements in homogeneous magnetic fields and magnetic fields having a homogeneous gradient.

The connecting leads 17 and 18 can be manufactured at the edges between the faces 21 and 20 and 22 and 20 according to the method described in EP-B-0,111,827. In this operation, soldered connections are provided after chamfering of the edge and deposition of the thin-film leads. It is also possible, however, before the manufacture of the gradiometer coils 15 and 16, to insert superconductive wires in grooves at the edges, on which the connecting leads 17 and 18 are then deposited using thin-film technology. The body 14 with the wires introduced must be polished before the thin film is deposited. The lead can subsequently be manufactured without soldering.

Before the plate 29 is applied to the gradiometer carrier 12, normally conductive leads, which lead to the amplifiers 2 and 3, are applied by bonding to the connections between the Josephson contacts.

When manufacturing the gradiometer carriers 12, it is preferable to proceed in such a way that a plurality of gradiometer carriers is first consolidated into a block, and the coils 15 and 16 are then deposited using thin-film technology. The gradiometer carriers are subsequently separated from the block. Thereafter, the gradiometer carriers 12 must still be coated on the side face 20.

Figure 3:
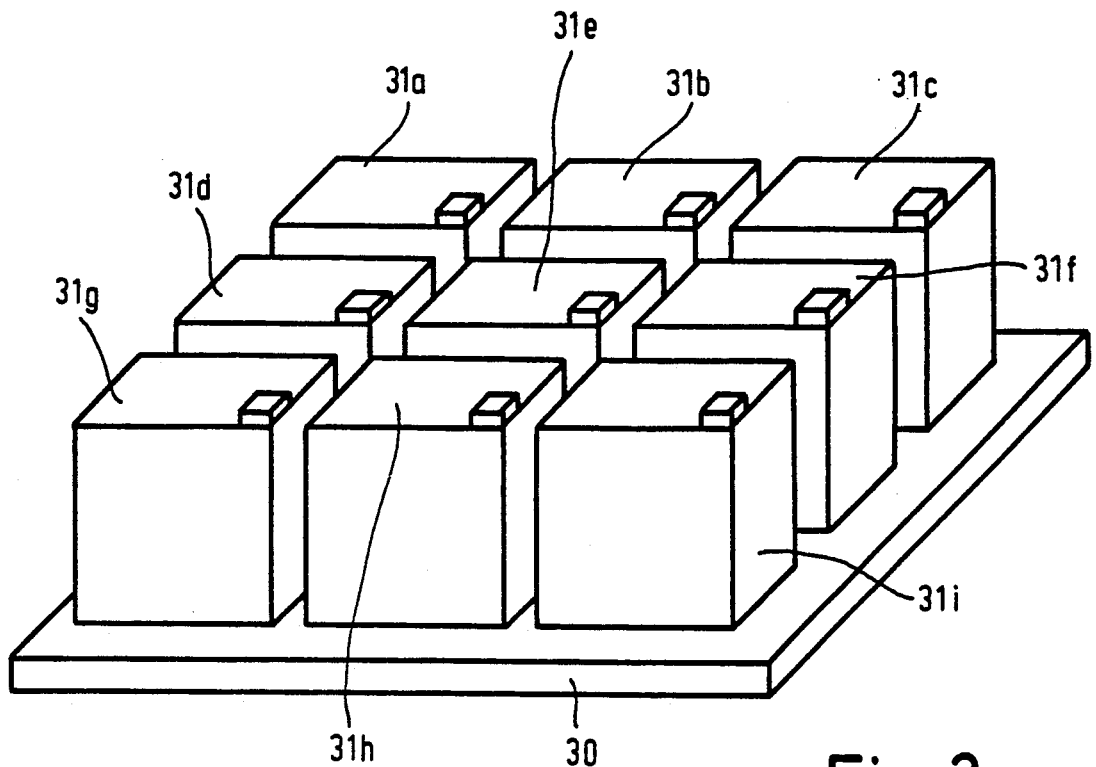
FIG. 3 shows a gradiometer carrier fixed to a base carrier.

Represented in FIG. 3 is a measuring apparatus in which various gradiometer carriers 31a to i are applied by glueing to a base carrier 30, for example, a plastic plate. The glue should likewise be chosen so that it is possible to detach a gradiometer carrier 31 from the base carrier 30. Due to the detachability of the gradiometer carriers 31a to i and of the SQUIDS fixed to them, a simple exchange is possible given a defect in a gradiometer coil or a SQUID.

Figure 4:
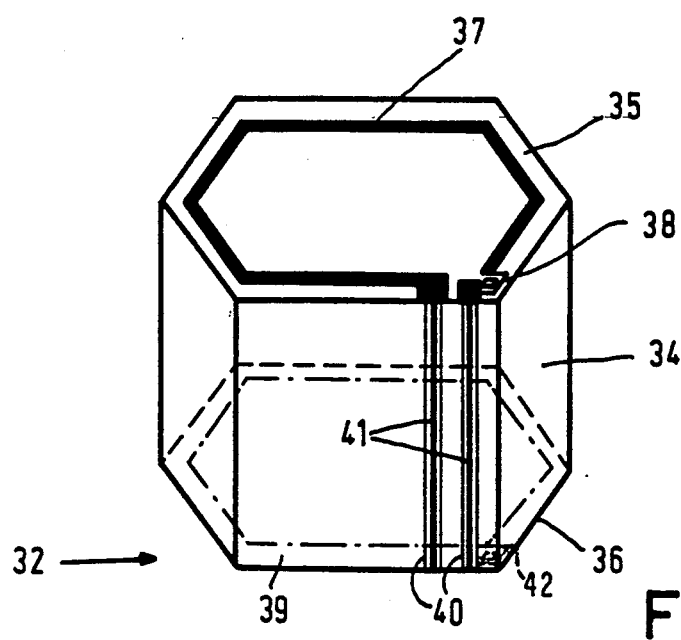
FIG. 4 shows a second illustrative embodiment of a gradiometer carrier.

A second embodiment of a gradiometer carrier 32, whose body 34 has a hexagonal cross-section, is represented in FIG. 4. Hexagonal gradiometer coils 37 are deposited on the base faces 35 and 36 having a hexagonal perimeter. The coupling-in coil 38 is applied in a small region outside the coils 37. In a manner similar to that represented in FIG. 2, an insulating layer, onto which the plate with the SQUID and the modulation coil is glued, is deposited on the coil 38. Connecting leads 41 of superconductive wire, for example niobium wire, which connect the two gradiometer coils 37 are glued into two V-shaped grooves 40 milled into a side face of the body 34.

When manufacturing such a gradiometer carrier 32 according to FIG. 4, grooves 40 are first cut, for example, milled, into the side face 39 of the body 34, and superconductive connecting leads 41 are introduced into these grooves. In the following step, the two base faces 35 and 36 are polished and the superconductive thin-film coils are subsequently manufactured in a step using planar lithography. Thereafter, an insulating layer is deposited, and the plate with the photolithographically deposited SQUID and modulation coil is subsequently glued on.

To achieve a good compensation of homogeneous magnetic fields, a similar superconductive structure 42 ought likewise to be applied to the base face 36, which structure is manufactured in exactly the same way as the coil 38, and is not attached to the other elements.

A measuring apparatus with the gradiometer carriers deposited on a base carrier is placed on the predetermined, usually circular, face of the cryostat system. By using gradiometer carriers with hexagonal cross-section it is possible to arrange a particularly high number of gradiometers on this predetermined circular face.

What is claimed is:

1. Apparatus for multichannel measurement of weak magnetic fields having assigned to each channel an assembly, which is arranged on a base carrier (30) and comprises a superconductive quantum interferences device (SQUID) (6, 27), a gradiometer of the first or higher order having at least one gradiometer coil (15, 16, 37) serving to detect the magnetic field, at least one coupling-in coil (9, 19, 38) serving to couple the field into the SQUID, superconductive connecting leads (10, 17, 18, 41) between the gradiometer coil and the coupling-in coil, and a modulation coil (7, 26), the gradiometer coil, the coupling-in coil and the SQUID being made of thin-film structures, said apparatus further having an evaluation device (11) serving to evaluate the signals generated in each channel by the SQUIDs, characterized in that a separate plate (29) is provided for each channel, on which the SQUID (6, 27) and the modulation coil (7, 26) are deposited, in that the assembly provided for each channel comprising the gradiometer coil (15, 16, 37), connecting leads (10, 17, 18, 41) and coupling-in coil (9, 19, 38) is in each case deposited on a separate gradiometer carrier (12, 32), and in that an insulating layer is applied to the gradiometer carrier over said coupling-in coil and the separate plate is attached detachably on the insulating layer of the separate gradiometer carrier, and the separate gradiometer carriers are attached detachably to a base carrier (30).

2. Apparatus according to claim 1, characterized in that the detachable attachments are glued joints.

3. Apparatus according to claim 1, characterized in that for compensating for homogeneous magnetic field the gradiometer has two gradiometer coils of different winding senses and wherein the gradiometer coil (15, 37) which has a first winding sense is arranged on a first base face (21, 35) of the gradiometer carrier (12, 32), and the gradiometer coil (16) having a second counter-directed winding sense is arranged on a second base face opposite the first base face (22, 36) of the gradiometer carrier.

4. Apparatus according to claim 3, characterized in that the coupling-in coil (19) is arranged on a side face (20) of the gradiometer carrier (12) which connects the base faces (21, 22).

5. Apparatus according to claim 3, characterized in that the first base face (35) of the gradiometer carrier is on a field-side of said apparatus and in that the coupling-in coil (38) is applied to said first base face (35) connected to said gradiometer coil (37) having the first winding sense.

6. Apparatus according to claim 5, characterized in that the connecting leads between the gradiometer coils (37) are superconductive wires (41) extending in grooves (40) of a side face (39) of the gradiometer carrier (32), which connects the two opposite base faces (35, 36) on which the gradiometer coils (37) are arranged.

7. Apparatus according to claim 5, characterized in that, for further compensating for homogeneous magnetic field, there is deposited on the second base face (36) opposite the coupling-in coil a superconductive conductor structure, which essentially corresponds to the structure of the coupling-in coil but which is not connected to the gradiometer coil having the second winding sense.

8. Apparatus according to one of claims 2 and 3, characterized in that a pair of superconductive screens (24, 28) are arranged respectively between the gradiometer carrier (12) and the coupling-in coil (19), and on a side of the plate (29) turned away from the gradiometer carrier.

9. Apparatus according to one of claims 1, 3, 4, 5, 6, and 7 characterized in that the detachable attachments are glued joints.

10. A method of manufacturing a detector for measurement of weak magnetic fields comprising:
first applying, using photolithography, thin-film gradiometer coils (15, 16, 37) to a pair of opposite base faces (21, 22, 35, 36) of a gradiometer carrier (12, 32);
second applying, using photolithography, a thin-film coupling in-coil (19, 38) on said gradiometer carrier;
third applying connecting leads (17, 18, 40, 41) on a side face (20, 39) of the gradiometer carrier between the gradiometer coils (15, 16);
depositing an insulating layer (25) over said coupling-in coil (19, 38); and
gluing a plate (29) over said insulating layer (25), which plate (29) contains a photolithography deposited superconductive quantum interference device (SQUID) and modulation coil, said gluing being with a glue chosen such that the plate (29) can be separated from said insulating layer (25) by application of mechanical force or a solvent.

11. The method of claim 10, further comprising, prior to said first applying,
cutting grooves (40) into said side face (39);
introducing said connecting leads, in the form of superconductive wires (41) into said grooves; and
polishing said pair of opposite base faces (35, 36).

12. Apparatus for multi-channel measurement of weak magnetic fields having assigned to each channel an assembly, which is arranged on a base carrier (30) and comprises a superconductive quantum interference device (SQUID) (6, 27), a gradiometer of the first or higher order having at least one gradiometer (15, 16, 37) serving to detect the magnetic field, at least one coupling-in coil (9, 19, 38) serving to couple the field into the SQUID, superconductive connecting leads (10, 17, 18, 41) between the gradiometer coil and the coupling-in coil, and a modulation coil (7, 26), the gradiometer coil, the coupling-in coil and the SQUID being made of thin-film structures, said apparatus further having an evaluation device (11) serving to evaluate the signals generated in each channel by the SQUIDs, characterized in that a separate plate (29) is provided for each channel, on which the SQUID (6, 27) and the modulation coil (7, 26) are deposited, in that the assembly provided for each channel comprising the gradiometer coil (15, 16, 37), connecting leads (10, 17, 18, 41) and coupling-in coil (9, 19, 38) is in each case deposited on a separate gradiometer carrier (12, 32) of hexagonal cross-section, having a pair of opposed base faces of hexagonal perimeter, in that the separate plate is attached detachably on the separate gradiometer carrier, and the separate radiometer carriers are attached detachably to a base carrier (30), in that the gradiometer has two gradiometer coils of different winding senses and wherein the gradiometer coil (15, 37) which has a first winding sense is arranged on one of said base faces (21, 35) of the gradiometer carrier (12, 32), and the gradiometer coil (16) having a second counter-directed winding sense is arranged on the other of said base faces (22, 36) of the gradiometer carrier.

13. Apparatus according to claim 12 characterized in that the detachable attachments are glued joints.

14. Apparatus for multi-channel measurement of weak magnetic fields having assigned to each channel an assembly which is arranged on a base carrier (30) and comprises a superconductive quantum interference device (SQUID) (6, 27), a gradiometer of the first or higher order having at least one gradiometer coil (15, 16, 37) serving to detect the magnetic field, at least one coupling-in coil (9, 19, 38) serving to couple the field into the SQUID, superconductive connecting leads (10, 17, 18, 41) between the gradiometer coil and the coupling-in coil, and a modulation coil (7, 26), the gradiometer coil, the coupling-in coil and the SQUID being made of thin-film structures, said apparatus further having an evaluation device (11) serving to evaluate the signals generated in each channel by the SQUIDs, characterized in that a separated plate (29) is provided for each channel, on which the SQUID (6, 27) and the modulation coils (7, 26) are deposited, in that the assembly provided for each channel comprising the gradiometer coil (15, 16, 37), connecting leads (10, 17, 18, 41) and coupling-in coil (9, 19, 38) is in each case deposited on a separate gradiometer carrier (12, 32), and in that an insulating layer is applied to the gradiometer carrier over said coupling-in coil and the separate plate is attached detachably on the insulating layer of the separate gradiometer carrier, and the separate gradiometer carriers are attached detachably to a base carrier (30) and in that a pair of superconductive screens (24, 28) are arranged respectively between the gradiometer carrier (12) and the coupling-in coil (19), and on a side of the plate (29) turned away from the gradiometer carrier.

* * * * *